United States Patent

Engeler et al.

[15] 3,686,748

[45] Aug. 29, 1972

[54] METHOD AND APPARATUS FOR PROVIDNG THERMAL CONTACT AND ELECTRICAL ISOLATION OF INTEGRATED CIRCUITS

[72] Inventors: William E. Engeler, Scotia; Dale M. Brown, Schenectady, both of N.Y.

[22] Filed: April 13, 1970

[21] Appl. No.: 27,650

[52] U.S. Cl. .........................29/577, 29/580, 29/589

[51] Int. Cl. ............................B01j 17/00, H01l 1/10

[58] Field of Search.........29/577, 577 TW, 580, 589; 317/234 A

[56] References Cited

UNITED STATES PATENTS

| | | | |
|---|---|---|---|
| 3,228,104 | 1/1966 | Emeis | 317/234 A |
| 3,343,255 | 9/1967 | Donovan | 29/577 |
| 3,366,793 | 1/1968 | Svedberg | 317/234 A |
| 3,414,968 | 12/1968 | Genser et al | 29/577 |
| 3,453,722 | 7/1969 | Ramsey | 29/577 |

*Primary Examiner*—John F. Campbell
*Assistant Examiner*—W. Tupman
*Attorney*—Paul A. Frank, John F. Ahern, Jerome C. Squillaro, Frank L. Neuhauser, Oscar B. Waddell and Joseph B. Forman

[57] ABSTRACT

A method and apparatus for providing electrical isolation between integrated circuits and a common high thermal conduction path to a heat sink are described. The method comprises providing an insulating film over the surface of a semiconductor wafer containing integrated circuits, forming a layer of high thermal conductivity material over the insulating film, selectively removing portions of the high thermal conductivity layer and the insulating film in regions between individual integrated circuits, selectively removing the semiconductor material from between integrated circuit elements and providing a low thermal resistance path between the high thermal conductivity layer and a suitable heat sink.

7 Claims, 6 Drawing Figures

Inventors:
William E. Engeler,
Dale M. Brown,
by [signature]
Their Attorney.

METHOD AND APPARATUS FOR PROVIDNG THERMAL CONTACT AND ELECTRICAL ISOLATION OF INTEGRATED CIRCUITS

The present invention relates to semiconductor integrated circuits and more particularly to improved integrated circuits which are electrically isolated from each other and which have a common thermal conductivity path to a heat sink.

The desirability and practicability of integrated circuits is well recognized; however, the problems of providing the requisite electrical isolation between separate circuit components or elements while providing a high thermal conductivity path to a heat sink still pose serious obstacles to the attainment of the full capabilities of integrated circuits. While various methods and apparatus have been proposed for solving these problems, the complexity or cost of such solutions has tended to limit their usefulness.

It is therefore an object of this invention to provide semiconductor integrated circuits which are electrically isolated from each other but which have a high thermal conductivity path to a heat sink.

It is another object of the instant invention to provide an integrated circuit having a plurality of electrically isolated circuit elements with a single high thermal conductivity path to a heat sink.

It is still a further object of the invention to provide a novel method for electrically isolating semiconductor integrated circuits and circuit elements while providing a high thermal conductivity path to a heat sink by using conventional semiconductor fabrication techniques.

These and other objects of the instant invention are achieved in one embodiment thereof by providing an insulating film over the surface of a semiconductor wafer containing integrated circuits, forming thereover a layer of a high thermal conductivity material such as a metal, removing the high thermal conductivity layer and the thin insulating film in regions where individual integrated circuits are to be separated, selectively removing the semiconductor material from the back side of the wafer and bonding the high thermal conductivity material to a suitable heat sink.

Figure 1:
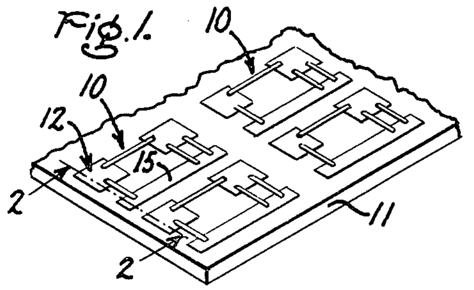

The novel features believed characteristic of the invention are set forth in the appended claims. The invention itself, together with further objects and advantages thereof may best be understood by reference to the following description, taken in connection with the accompanying drawing, in which:

FIG. 1 is a perspective view of a semiconductor wafer with several interconnected integrated circuits fabricated therein; and FIGS. 2 through 6 illustrates respectively a sequence of steps in processing an integrated circuit in accord with one embodiment of the invention.

By way of example, FIG. 1 illustrates an embodiment of the invention wherein a plurality of integrated circuits generally designated by the numeral 10 are fabricated on a semiconductor substrate 11. Each integrated circuit 10 is fabricated on the substrate 11 in accord with well known procedures in the art. For example, each integrated circuit may comprise transistors, diodes, resistors, or capacitors formed, for example, by diffusion of selected impurities into the semiconductor substrate. By suitable process steps well known in the art, it is possible to produce a wide variety of circuit elements which may be interconnected to form a large number of integrated circuits on a single semiconductor substrate.

Figure 2:
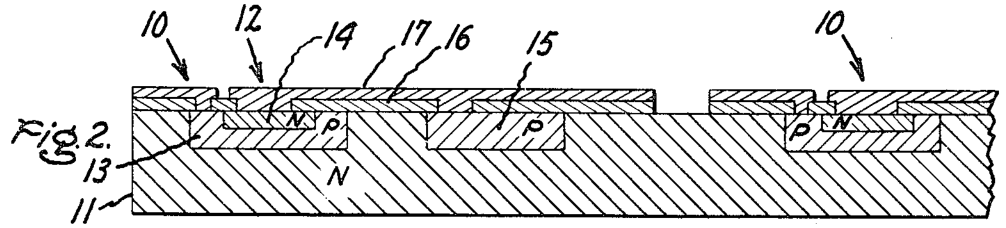
Figure 3:
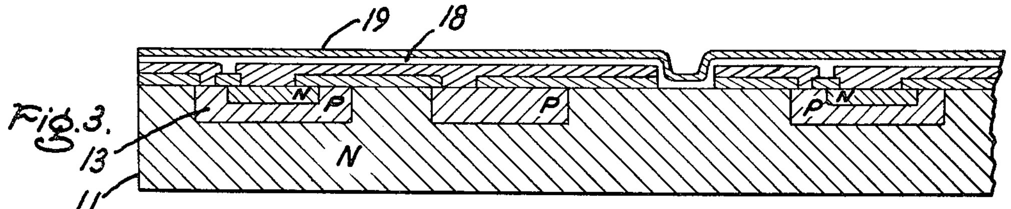

FIG. 2 is a cross-sectional view taken along the lines 2—2 of FIG. 1 and more clearly illustrates the details of a typical integrated circuit. In particular, the semiconductor substrate 11 is illustrated as having an n-type conductivity characteristic with several diffusion regions therein. For example, the integrated circuit 10 may include a first transistor 12 comprising a p-type diffusion region 13 within which there is formed a shallow n-type diffusion region 14. Adjacent the first transistor is a second diffusion region of p-type conductivity for forming a resistor 15. The resistor 15 may similarly be formed by diffusion of an impurity into the substrate. Subsequent to the diffusion step, a protective and passivating coating 16, as for example, silicon dioxide, is formed over the surface of the substrate by deposition or thermal growth. Openings are then etched through the oxide to make electrical contact to selected portions of the semiconductor substrate.

Electrical connections between circuit elements are preferably achieved by applying a metal layer over the oxide surface and suitably etching the metal layer to provide the desired electrical interconnections. For example, as illustrated in FIG. 2, electrical connection is provided between the n-type region 14 and the resistor 15 by a patterned metal film 17 which may, for example, by formed of molybdenum, tungsten, aluminum or gold. Techniques for forming such interconnections between various circuit elements are well known in the art and are not described herein since they form no part of the instant invention.

In accord with one embodiment of the invention, electrical isolation between circuit elements and the high thermal conductivity path between the circuit elements and a heat sink is provided as illustrated in FIGS. 3 through 6. First, a thin insulating film 18 is formed over the surface of the integrated circuits. The insulating film 18 may, for example, be an oxide, a nitride or combinations of oxides and nitrides of silicon or most any other insulating film useful in the semiconductor art. The primary requirements that the insulating film should preferably exhibit are a low thermal coefficient of expansion and one which approximates the thermal expansion of the substrate. For example, silicon substrates have thermal coefficients of expansion of approximately $5 \times 10^{-6}$ inches per inch per degree C. Although it is also desirable if the insulating film has a relatively high thermal conductivity, this characteristic is unnecessary if the thickness of the film is sufficiently thin so that the thermal conduction path through the insulating film is not a significant factor in determining the efficiency of heat transfer from an integrated circuit to a heat sink. For example, if the thin insulating film 18 is silicon nitride or silicon dioxide, a film thickness of between 2,000 to 5,000 Angstroms produces a satisfactory conduction path. Those skilled in the art can readily appreciate that both thinner and thicker films could be employed if desired; however, thinner films produce a generally undesirable amount of shunt capacity between the integrated circuit and the heat sink and thicker films produce poor thermal conductivity paths to the heat sink. Therefore, in practising the instant invention, it is preferable that the thickness of the insulating film 18 be commensurate with the tolerable shunt capacitance and the heat loss.

An insulating film of silicon nitride may, for example, be conveniently produced over the surface of the integrated circuit by a thermal disassociation reaction of anhydrous ammonia gas flowed over the surface of the wafer while the wafer is heated to as high a temperature as is permitted by the various circuit elements. U.S. Pat. No. 3,385,729 describes such a process in greater detail and reference may be made thereto if desired. Films of silicon dioxide may, for example, be produced by vapor deposition from materials such as silane ($SiH_4$) and oxygen, if desired.

Over the surface of the insulating film 18, there is provided a layer or film of a high thermal conductivity and low temperature coefficient of expansion material 19, such as molybdenum, tungsten, alloys of molybdenum and tungsten or other materials having the aforementioned desirable characteristics. The high thermal conductivity layer 19 may be formed by various techniques well known in the art. For example, a layer of molybdenum or tungsten may be formed on an integrated circuit by pyrolytic reduction of molybdenum tetrachloride ($MOCl_5$) or tungsten hexafluoride ($WF_6$) respectively, while the integrated circuit is held at a temperature of approximately 500° C. Alternately, a layer of molybdenum or tungsten may be formed by sputtering from a cathode. These and other processes for producing such films are well known in the art; however, reference may be made to a textbook entitled "Microelectronics' by Max Fogiel, published in 1968 by the Research and Education Association of New York, if desired. Additionally, if desired, a thin layer of a wetting material such as electrodeless nickel may be added to improve wetability during soldering.

By way of example, assume that the insulating film 18 is silicon nitride and the high thermal conductivity film 19 is molybdenum. Each of these films is then patterned by photolithographic etching techniques, for example, so as to remove the molybdenum and silicon nitride films in those regions where the individual integrated circuits are to be separated and to leave unetched those regions covering the individual circuits. Techniques for etching metal films and insulating films are well known in the art; however, reference may be made to an Eastman Kodak publication entitled "Photosensitive Resists for Industry", published in 1962 for more specific details if desired.

Figure 4:
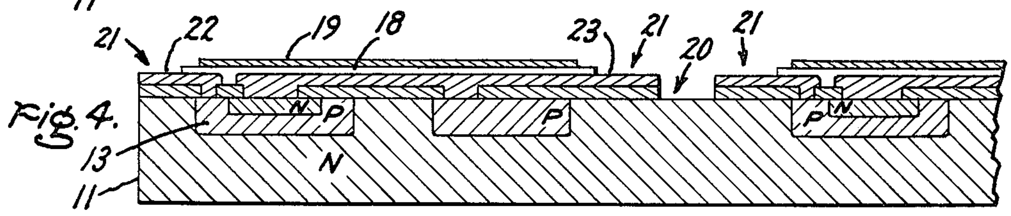

FIG. 4 illustrates the semiconductor substrate after the molybdenum and silicon nitride films are removed in those regions where the integrated circuits are to be separated. These regions are generally indicated by the numerals 20 and 21. As also illustrated in FIG. 4, the leads 22 and 23 which make contact to the transistor 12 and the resistor 15, extend linearly along the surface of the semiconductor substrate a sufficient distance to permit these leads to be bonded to electrodes of adjacent circuits, for example, or to electrodes of a package.

Figure 5:
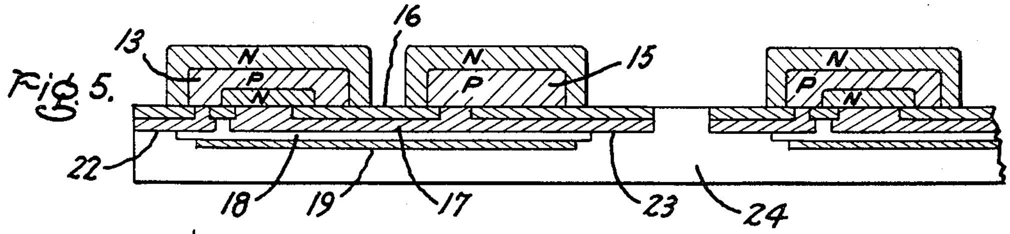

To complete the separation of each integrated circuit, the surface of the substrate is covered with a brown wax, illustrated generally by the numeral 24. The substrate is then turned over as illustrated in FIG. 5. The semiconductor material 12 may then be photolithographically etched from between discrete circuit elements which would otherwise be electrically short-circuited by the presence of the semiconductor substrate material. In a similar manner the semiconductor material 12 may be removed from between integrated circuits. Additionally, the semiconductor material 12 may be reduced in thickness, if desired. As illustrated in FIG. 5, the semiconductor substrate material 12 is etched away in all regions except those surrounding the first transistor 12 and the resistor 15. Each integrated circuit 11 and the circuit elements are now electrically isolated from each other but remain mechanically connected to each other by means of the silicon nitride and molybdenum films and electrically interconnected by the leads 22 and 23.

Figure 6:
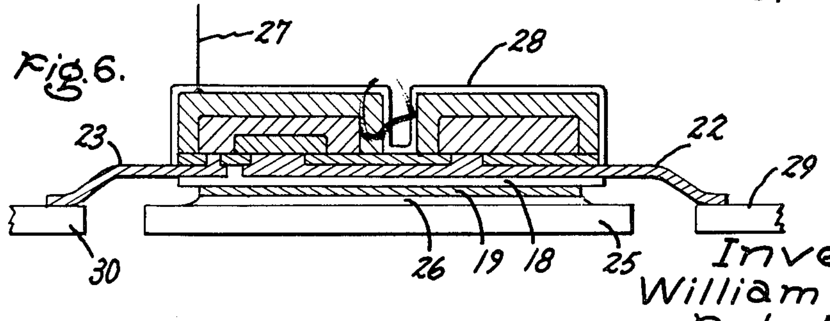

As illustrated in FIG. 6, each integrated circuit is then removed from the wax and suitably connected or bonded, preferably through a low thermal resistance path, to a heat sink. As illustrated, this may be achieved by soldering to a heat sink 25 with a suitable solder or eutectic 26 such as Au–Si, Au–Ge, Ag–Si, Ag–Ge, Sn or Pb, for example. In this way, a common thermal contact is provided to all individual circuit elements while still providing electrical isolation therebetween. An electrical contact 27 may then be made to the n-type region of transistor 12 by thermocompression bonding, for example. The exposed semiconductor surfaces may then be encapsulated with a protective coating 28, such as, for example, silicon dioxide, if desired. The leads 22 and 23 may, for example, be connected to electrodes 29 and 30, respectively.

From the foregoing description, it is readily apparent that an improved method for providing electrical isolation between integrated circuits and circuit elements with a high thermal conductivity path between the integrated circuit and a heat sink is disclosed. Although the process has been described with relation to only two integrated circuits, the process is equally applicable to more complicated configurations wherein large numbers of circuits and circuit elements are to be electrically isolated from each other. By utilizing the above-described process, one of the primary difficulties of the present-day beam lead technology is overcome.

It should be further understood that in situations where electrical isolation is either unnecessary or provided by other means, the high thermal conductivity path between semiconductor elements and a heat sink can still be provided in accord with the teachings of the instant invention.

While we have shown and described several embodiments of our invention, it will be apparent to those skilled in the art that many changes and modifications can be made thereto without departing from our invention in its broader aspects. Therefore, the appended claims are intended to cover all such changes and modifications as fall within the true spirit and scope of our invention.

What we claim as new and desire to secure by Letters Patent of the United States is:

1. A method for providing electrical isolation between integrated circuit elements formed on one surface of a semiconductor substrate while providing a common thermal conductivity path to a heat sink, said method comprising:

depositing an insulating film over said one surface of said substrate including said integrated circuit elements;

forming a layer of a thermally conducting material over said insulating film;

removing selected portions of the semiconductor substrate material from between integrated circuit elements to provide electrical isolation therebetween and to expose electrical leads for contacting said circuit elements; and bonding said thermally conducting material to said heat sink.

2. The method of claim 1 wherein said insulating film has a thickness in the range of 2,000 to 5,000 Angstroms.

3. The method of claim 1 wherein said high thermal conductivity material is metallic.

4. The method of claim 1 wherein said high thermal conductivity material is selected from the group consisting of molybdenum, tungsten and alloys of molybdenum and tungsten.

5. The method of claim 1 wherein said selected portions of said semiconductor substrate are removed by photolithographic etching thereof.

6. The method of claim 1 wherein said insulating film is selected from the group consisting of silicon nitride, silicon dioxide and combinations of silicon nitride and silicon dioxide.

7. The method of claim 1 wherein the step of removing selected portions of the semiconductor substrate is followed by encapsulating the integrated circuit elements with a protective coating.

* * * * *